(12) United States Patent
Sun et al.

(10) Patent No.: US 10,680,560 B2
(45) Date of Patent: Jun. 9, 2020

(54) TRANSFORMER OR INDUCTOR SHARING IN A RADIO FREQUENCY AMPLIFIER AND METHOD THEREFOR

(71) Applicant: MediaTek, Inc., Hsinchu (TW)

(72) Inventors: Chih-Hao Sun, Taipei (TW); Po-Yun Hsiao, Hsinchu (TW); Chin-Yen Chao, Hsinchu (TW); Yi-Bin Lee, Hsinchu (TW)

(73) Assignee: MediaTek, Inc., Hsinchu (TW)

( * ) Notice: Subject to any disclaimer, the term of this patent is extended or adjusted under 35 U.S.C. 154(b) by 0 days.

(21) Appl. No.: 16/047,176

(22) Filed: Jul. 27, 2018

(65) Prior Publication Data

US 2019/0068128 A1    Feb. 28, 2019

Related U.S. Application Data

(60) Provisional application No. 62/551,821, filed on Aug. 30, 2017.

(51) Int. Cl.
*H03G 3/30* (2006.01)
*H03F 1/08* (2006.01)
(Continued)

(52) U.S. Cl.
CPC ........... *H03F 1/083* (2013.01); *H03F 1/0205* (2013.01); *H03F 1/0277* (2013.01); *H03F 1/18* (2013.01); *H03F 3/193* (2013.01); *H03F 3/195* (2013.01); *H03F 3/211* (2013.01); *H03F 3/72* (2013.01); *H03G 3/3042* (2013.01); *H04B 1/04* (2013.01); *H03F 3/245* (2013.01); *H03F 2200/294* (2013.01); *H03F 2200/451* (2013.01); *H03G 2201/103* (2013.01); *H03G 2201/307* (2013.01); *H04B 2001/0408* (2013.01)

(58) Field of Classification Search
CPC .......... H03F 1/083; H03F 1/0277; H03F 3/72; H03F 3/211; H03F 3/193; H03F 1/18; H03F 3/195; H03F 1/0205; H03F 2200/294; H03F 2200/451; H03F 3/245; H03F 2200/541; H03F 1/565; H03F 3/602; H03F 3/604; H03F 1/0288; H04B 1/04; H04B 2001/0408; H03G 3/3042; H03G 2201/307; H03G 2201/103
USPC ..................................... 330/124 R, 195, 295
See application file for complete search history.

(56) References Cited

U.S. PATENT DOCUMENTS 8,269,561 B1    9/2012  Park
9,083,293 B2    7/2015  Chien et al.
(Continued)

FOREIGN PATENT DOCUMENTS

EP          2234271 A1     9/2010

*Primary Examiner* — Khanh V Nguyen
(74) *Attorney, Agent, or Firm* — Optimus Patents US, LLC

(57) ABSTRACT

A communication unit includes a plurality of parallel radio frequency, RF, signal paths. Located between a first RF signal path of the plurality of parallel RF signal paths comprising at least one first RF amplifier and a second signal path comprising at least one second RF amplifier is one of a shared inductor or shared transformer. The at least one first RF amplifier is coupled to a supply voltage via a first switch and at least one second RF amplifier is coupled to the supply voltage via a second switch, and the first switch is closed that provides the supply voltage to the at least one second RF amplifier whilst the second switch is opened.

14 Claims, 4 Drawing Sheets

(51) Int. Cl.
*H03F 3/195* (2006.01)
*H03F 1/02* (2006.01)
*H04B 1/04* (2006.01)
*H03F 3/72* (2006.01)
*H03F 3/21* (2006.01)
*H03F 3/193* (2006.01)
*H03F 1/18* (2006.01)
*H03F 3/24* (2006.01)

(56) References Cited

U.S. PATENT DOCUMENTS

| | | | | |
|---|---|---|---|---|
| 9,166,852 B2* | 10/2015 | Davierwalla | ............ | H03G 3/20 |
| 9,602,066 B2* | 3/2017 | Imazeki | .................. | H03F 1/223 |
| 10,033,338 B2* | 7/2018 | Trotskovsky | ......... | H04W 84/04 |
| 10,256,783 B2* | 4/2019 | Chu | ..................... | H04B 1/0483 |
| 2010/0127780 A1* | 5/2010 | An | ........................ | H03F 1/0266 |
| | | | | 330/295 |

* cited by examiner

FIG. 1 - Prior Art

TRANSFORMER OR INDUCTOR SHARING IN A RADIO FREQUENCY AMPLIFIER AND METHOD THEREFOR

FIELD OF THE INVENTION

The field of this invention relates to a communication unit and an integrated circuit having a radio frequency circuit and a method for transformer or inductor sharing. In particular, the field of this invention relates to transformer or inductor sharing in a design of a high frequency and broadband low noise amplifier (LNA) or programmable-gain amplifier (PGA) where multiple parallel amplifiers are used that share the transformer or inductor.

BACKGROUND OF THE INVENTION

A primary focus and application of the present invention is in the field of radio frequency (RF) amplifiers for transmitters and/or receivers capable of use in wireless telecommunication units. The third generation partnership project (3GPP™) is a mobile (wireless) communications collaboration between groups of telecommunications standards associations. One of the currently developed standards is the long term evolved (LTE™) standard. LTE™ is a standard for high-speed wireless communication for mobile devices and data terminals, based on the global system for mobile (GSM™) communications or Enhanced Data GSM Environment (EDGE) and universal mobile telecommunications standards (UMTS)/High Speed packet access (HSPA) technologies. These technologies increase the capacity and speed using different radio interfaces together with providing core network improvements.

Continuing pressure on the limited spectrum available for radio communication systems is forcing the development of spectrally-efficient linear modulation schemes and mechanisms that can better utilise limited available communications bandwidths. Carrier aggregation is used in LTE-Advanced in order to increase the bandwidth, and thereby increase the communication bit-rate, where a maximum of five component carriers (of up to 20 MHz each) can be aggregated, hence providing a maximum aggregated bandwidth of 100 MHz.

The easiest way to arrange aggregation is to use contiguous component carriers within the same operating frequency band (as defined for LTE™), so called intra-band contiguous carrier aggregation (ICA).

For non-contiguous carrier aggregation (NCCA) cases, the bands are separated by one, or more, frequency gap(s). Inter-band non-contiguous carrier aggregation is a form of carrier aggregation that uses different frequency bands. It is particularly useful where there is fragmentation of frequency bands, some of which may be, say, only 10 MHz wide. For a subscriber unit (sometimes referred to as a mobile station or a user equipment (UE) in GSM or LTE™ terminology), a use of multiple transceivers within the single device is often required, with the usual impact on cost, performance and power. In addition to this there are also additional design complexities resulting from the need to reduce intermodulation and cross modulation from multiple (e.g. two) transceivers.

In particular, in radio frequency designs that support wide operational bandwidth, or that support carrier aggregation across multiple supported carrier frequencies, multiple low noise amplifiers (LNAs) and/or programmable-gain amplifier (PGAs) may be used in parallel. As these LNAs or PGAs operate at high or very high radio frequencies, the signal paths from multiple amplifiers are typically combined using inductors or transformers.

LNAs and PGAs are found in radio communication systems, as well as medical instruments and electronic equipment. A typical LNA or PGA may supply a power gain of 100 (i.e. 20 decibels (dB)), whilst decreasing a signal-to-noise ratio by less than a factor of two (i.e. exhibiting a 3 dB noise figure (NF)). Although LNAs are primarily concerned with weak signals that are just above the noise floor, they must also be designed to consider the presence of larger signals that may cause intermodulation distortion.

Referring to FIG. 1, a known radio frequency (RF) amplifier circuit 100 is illustrated, where multiple RF amplifiers 130, 140 are connected in parallel. The outputs of each of the respective multiple RF amplifiers 130, 140 exhibits a parasitic capacitance 135, 145. The exhibited parasitic capacitances can result from overlapped area between gate and source/drain ports, as well as result from the diode (effect) between the ports.

The output of each of the respective multiple RF amplifiers 130, 140 is connected to a shared inductor (L1) 115. In some instances, the shared inductor (L1) 115 may be a transformer input inductance of a RF transformer 110. The RF transformer is provided by a voltage supply 105 and includes a transformer output inductance 112.

In some applications, for example lower frequency applications of, say, less than 1 GHz, the parasitic capacitances 135, 145 have little or no effect on the performance of the RF amplifier circuit 100. Thus, this illustrated architecture is the simplest way for inductor or transformer sharing of multiple RF amplifiers 130, 140 that are connected in parallel. However, in some instances, for example at frequencies higher than 1 GHz, the respective exhibited parasitic capacitances 135, 145 have an increasingly adverse frequency-response or non-linearity effect (as they emanate from cascade devices, which are nonlinear compared to a metal-oxide-metal (MOM) capacitor), when they are connected to inductors or transformers that combine the outputs of the respective RF amplifiers 130, 140. In particular, when a large number of RF amplifiers are connected in parallel, the inventors of the present invention appreciated that when the second RF amplifier 140 is turned 'on', the path connecting the RF amplifier 140 to a first inductor 115 (or an input side of an RF transformer) is also connected to both parasitic capacitances 135, 145. Hence, the total amount of parasitic capacitance, and the effect thereon of the additional parasitic capacitance on other connected RF amplifiers, increases with the number of parallel RF amplifiers.

In some known applications, it is possible to reduce the effect of parasitic capacitances 135, 145 by using smaller cascade devices; however, such an approach causes a poorer linearity performance.

Thus, the inventors of the present invention have identified a need for a reduced loading effect due to such parasitic capacitances of parallel paths of RF amplifiers that are connected to such shared inductors or transformers. In particular, a more efficient solution is needed in order to support multiple parallel RF amplifiers, for example for supporting Inter-band Carrier Aggregation (ICA) and Non-Contiguous Carrier Aggregation (NCCA) applications in an LTE™ or similar system.

SUMMARY OF THE INVENTION

Accordingly, the invention seeks to mitigate, alleviate or eliminate one or more of the above mentioned disadvantages singly or in any combination.

According to a first aspect of the invention, there is described a communication unit that includes a plurality of parallel radio frequency, RF, signal paths. Located between a first RF signal path of the plurality of parallel RF signal paths comprising at least one first RF amplifier and a second signal path comprising at least one second RF amplifier is one of a shared inductor or shared transformer. The at least one first RF amplifier is coupled to a supply voltage via a first switch and at least one second RF amplifier is coupled to the supply voltage via a second switch, and the first switch is closed that provides the supply voltage to the at least one first RF amplifier whilst the second switch is opened.

In this manner, the use of a shared inductor or shared transformer located between parallel RF amplifiers or RF amplifier paths, together with selective closing/opening of switches, connected to the RF amplifiers either side of the shared inductor or shared transformer, is able to cause the shared inductor or transformer to create a high impedance at the output of the at least one first RF amplifier, and thereby reduce adverse effects from, say, parasitic capacitances associated with the outputs of other parallel RF amplifiers.

In an optional example embodiment, the closing of the first switch causes the shared inductor or shared transformer to create a high impedance at the output of the at least one second RF amplifier. In this optional example embodiment, the use of the switched power supply that is routed through the shared inductor or shared transformer effectively isolates the first and second RF amplifiers.

In an optional example embodiment, the at least one first RF amplifier exhibits a first output parasitic capacitance and the at least one second RF amplifier exhibits a second output parasitic capacitance connected via the shared inductor or shared transformer and the closed first switch causes the shared inductor or shared transformer to create a high impedance at the output of the at least one first RF amplifier, which effectively isolates the exhibited output parasitic capacitances of the first and second RF amplifiers. In this manner, the closing of the switch reduces the effect of the exhibited second output parasitic capacitance at the output of the at least one first RF amplifier that is also connected to the shared inductor or shared transformer. In this optional example embodiment, the creation of a high impedance at the output of the at least one second RF amplifier, with the inclusion of the shared inductor or shared transformer, reduces the exhibited parasitic capacitance effect from the other amplifiers that are not turned 'on', but that are connected to the shared inductor or shared transformer, on the output of the RF amplifier that is turned 'on'.

In an optional example embodiment, multiple selectable RF amplifiers or multiple sets of selectable RF amplifiers may be located on either side of the shared inductor or transformer. In this example, a first selectable RF amplifier or set of selectable RF amplifiers from the multiple selectable RF amplifiers or multiple sets of selectable RF amplifiers may be selectively connected to a different internal portion of the shared inductor or shared transformer, thereby adjusting an inductance value of the shared inductor or shared transformer. In this manner, an inherent adjustment of an inductance value of the shared inductor or shared RF transformer by adjusting the connection point a first selectable RF amplifier or set of selectable RF amplifiers may enable the communication unit to support a required new frequency band.

In an optional example embodiment, the at least one first RF amplifier and at least one second RF amplifier may be low noise amplifiers in a receiver path of the communication unit. In an optional example embodiment, the at least one first RF amplifier and at least one second RF amplifier may be programmable gain amplifiers in a transmitter path of the communication unit. In an optional example embodiment, the at least one first RF amplifier and at least one second RF amplifier may each comprise multiple RF amplifiers located on slices wherein sets of slices are separated by the shared inductor or shared transformer. In this manner, the concept herein described may be employed in various amplification circuits within the communication unit and adapted for any number of amplifier elements or circuits.

In a second aspect of the invention, a radio frequency integrated circuit, RFIC, may include the features of the first aspect of the invention.

In a third aspect of the invention, a method for sharing an inductor or transformer between multiple RF amplifiers in a communication unit is described. The method includes: locating (e.g. positioning) a shared inductor or shared transformer between a first RF signal path of a plurality of parallel RF signal paths comprising at least one first RF amplifier and a second signal path comprising at least one second RF amplifier; closing a first switch connecting a supply voltage to the at least one first RF amplifier; and opening a second switch connecting the supply voltage to the at least one second RF amplifier, such that the shared inductor or transformer creates a high impedance at the output of the at least one first RF amplifier.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIGs are illustrated for simplicity and clarity and have not necessarily been drawn to scale.

DETAILED DESCRIPTION

Examples of the invention will be described in terms of various RF amplifier circuits configured for sharing an inductor or transformer in order to reduce a loading effect of exhibited parasitic capacitances on parallel paths from the RF amplifiers, for example as used in a wireless communication unit supporting Long Term Evolved (LTE™) communications, such as an user equipment (UE). However, it is envisaged that the circuits and concepts for sharing an inductor or transformer in order to reduce a loading effect of exhibited parasitic capacitances of parallel paths from the RF amplifiers herein described may be applicable in any situation or system or communication unit where multiple RF amplifiers are employed in a parallel manner.

In particular, examples of the invention may be employed in any RF amplifier circuit where the effects of parasitic capacitance may cause a problem, for example with respect to gain, bandwidth or second order intrinsic intermodulation product (IIP2) performance.

In one example of the invention it is envisaged that multiple RF amplifiers may be used to support the same frequency band. In this configuration, the shared inductor/transformer is not changed and the direction of the current flow within the shared inductor/transformer may be used in RF amplifiers to reduce the effect of the exhibited parasitic capacitances. In other examples of the invention, it is envisaged that the multiple RF amplifiers may be used to support different frequency bands. In this configuration, examples of the invention no longer always connect the RF amplifiers to the two end points of the shared inductor/transformer. Depending upon the supported frequency bands, some examples propose to connect the RF amplifier to a selectable internal point of the shared inductor/transformer. For example, a lower frequency band should observe a higher inductance and a higher frequency band should observe a lower inductance. Notably, the same (size of) shared inductor/transformer is used, but the connecting point of the amplifier(s) is/are selectively adjusted in this configuration.

Furthermore, because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 2:
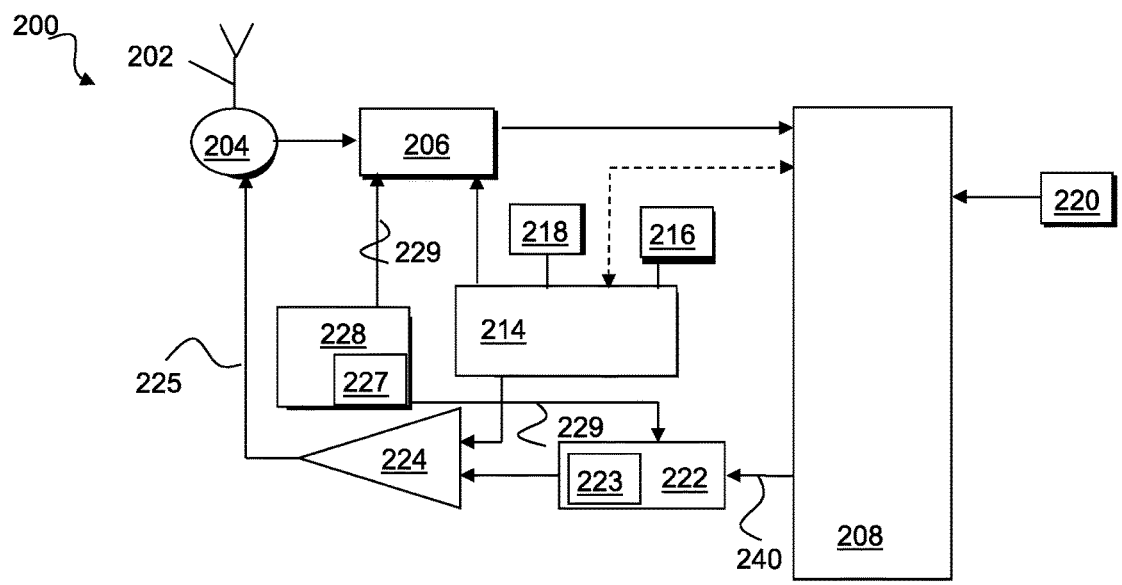
FIG. 2 illustrates a simplified block diagram of an example of a communication unit where multiple RF amplifiers are connected in parallel, adapted in accordance with some examples of the invention.

Referring now to FIG. 2, a block diagram of a wireless communication unit 200, adapted in accordance with some example embodiments of the invention, is shown. In practice, purely for the purposes of explaining embodiments of the invention, the wireless communication unit is described in terms of a wireless subscriber communication unit in the form of an user equipment configured to support the LTE™ communication standard. The wireless communication unit 200 contains an antenna arrangement 202, for radiating signals and/or for receiving transmissions, coupled to an antenna switch 204 that provides isolation between receive and transmit chains within the wireless communication unit 200. One or more receiver chains, as known in the art, include(s) receiver front-end circuitry 206 (effectively providing reception, filtering and intermediate or base-band frequency conversion). In some examples, the antenna arrangement may be an antenna array that includes multiple antenna elements that each provide a receive path carrying a received signal to the receiver front-end circuitry 206.

The receiver front-end circuitry 206 is coupled to a signal processing module 208 (generally realized by a Digital Signal Processor (DSP)). A skilled artisan will appreciate that the level of integration of receiver circuits or components may be, in some instances, implementation-dependent.

A controller 214 maintains overall operational control of the wireless communication unit 200. The controller 214 is coupled to the receiver front-end circuitry 206 and the signal processing module 208. In some examples, the controller 214 is also coupled to at least one memory device 216 that selectively stores data relating to operating functions of the communication unit. A timer 218 is operably coupled to the controller 214 to control the timing of operations (e.g. transmission or reception of time-dependent signals) within the wireless communication unit 200.

For completeness, the wireless communication unit 200 has a transmit chain that includes transmitter/modulation circuitry 222 and a power amplifier 224 coupled to the antenna arrangement 202, which may comprise for example an antenna array, or plurality of antennas. The transmitter/modulation circuitry 222 and the power amplifier 224 are operationally responsive to the controller 214.

In some examples, the power amplifier 224 and/or transmitter/modulation circuitry 222 may include multiple transmit paths carrying a transmit signal to the antenna 202 (or antenna array). Frequency generation circuit 228 includes at least one local oscillator, LO, 227 and is operably coupled to the receiver front-end circuitry 206 and the transmitter/modulation circuitry 222 and arranged to provide local oscillator signals 229 thereto.

Figure 3:
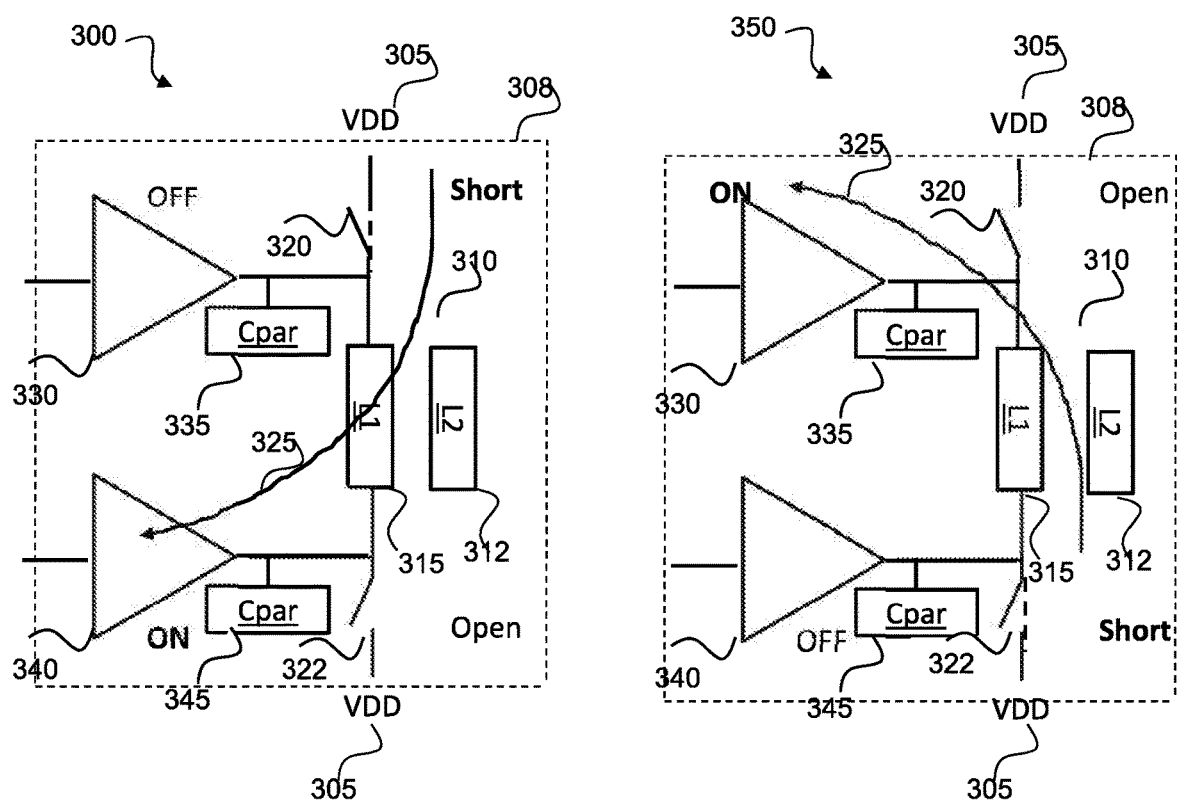
FIG. 3 illustrates a first example overview of a switched RF amplifier circuit, in accordance with some examples of the invention.
Figure 4:
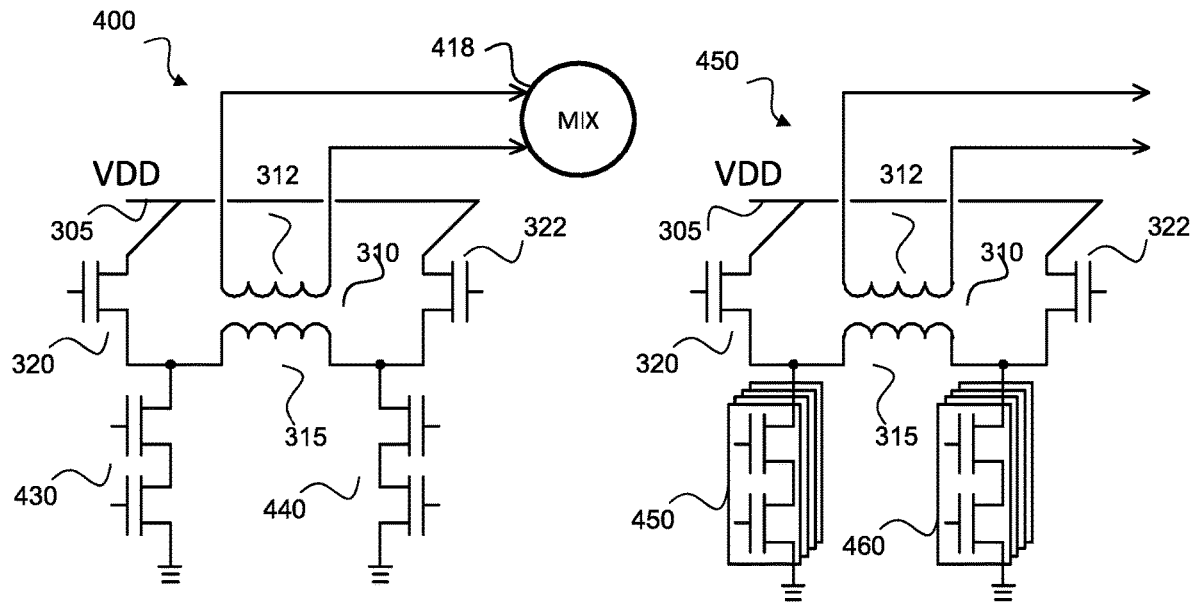
FIG. 4 illustrates a second example overview of a switched RF amplifier circuit for both a two amplifier and an N-amplifier circuit, in accordance with some examples of the invention.
Figure 5:
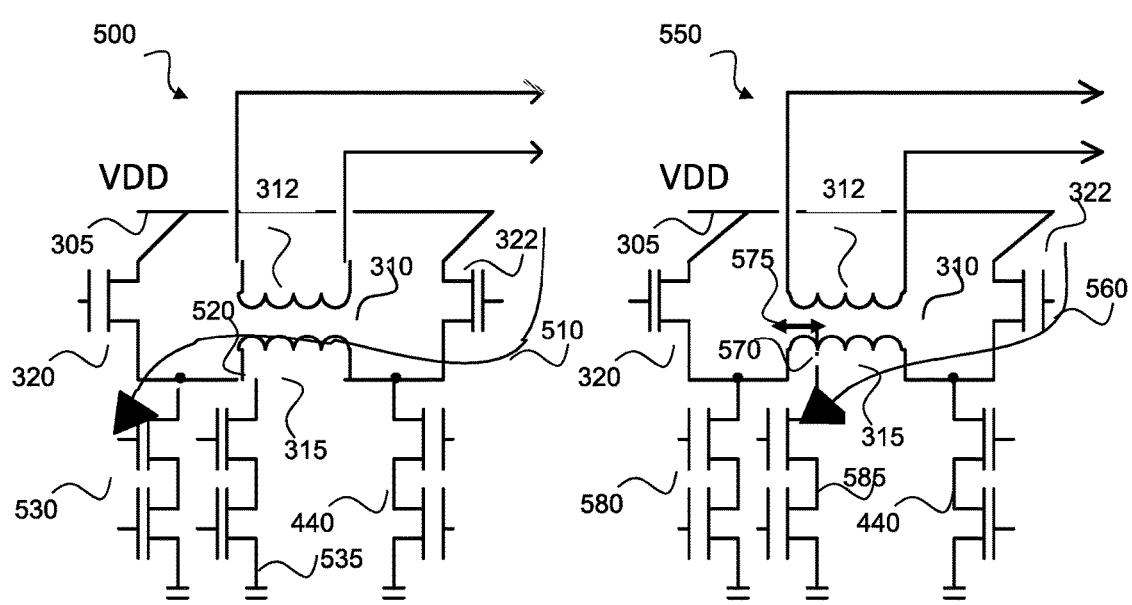
FIG. 5 illustrates a third example overview of a switched RF amplifier circuit configured to support either a lower frequency band with a larger shared inductor employed or a higher frequency band with a smaller shared inductor employed, in accordance with some examples of the invention.

In some example embodiments, multiple parallel RF amplifiers, circuits or devices, employed in one or more of: receiver front-end circuitry 206 (e.g. a plurality of LNAs), transmitter/modulation circuitry 222 (e.g. a plurality of PGAs) or power amplifier 224, have been adapted in accordance with the RF amplifier architecture of FIGS. 3 to 5. In particular, whenever multiple active RF devices are used in the communication unit, it is envisaged that such multiple active RF devices may be configured to share a common load to the supply voltage (VDD). In this manner, the topology described in FIGS. 3 to 5 may be adapted to any number of active devices and signal feeder circuits.

Clearly, a number of the various components within the wireless communication unit 200 can be realized in discrete or integrated component form, with an ultimate structure therefore being application-specific or design-based.

Referring now to FIG. 3, a first example configuration of an RF amplifier circuit 300 adapted in accordance with some examples of the invention radio frequency (RF) amplifier circuit 300 is illustrated, where multiple RF amplifiers 330, 340 are connected in parallel.

The outputs of each of the respective multiple RF amplifiers 330, 340 exhibit a parasitic capacitance 335, 345. In accordance with examples of the invention, the output of each of the respective multiple RF amplifiers 330, 340 is connected to either side of a shared inductor 315 by a switch 320, 322 or switch network (with a simple arrangement of switch 320, 322 encompassing the switch network in this example). In some instances, the shared inductor 315 may be a transformer input inductance of a shared RF transformer 310. In a shared RF transformer 310 design, the shared RF transformer 310 is provided by a voltage supply 305 and includes a transformer output inductance 312.

In a receiver sense, for example when applied in a low noise amplifier (LNA) design in receiver front-end circuitry 206 of FIG. 2, the output of the shared RF transformer 310 may be provided to a mixer (not shown in this example). A skilled artisan will appreciate that the concept described herein is especially useful for receiver designs subject to stringent IIP2 specifications, not least because the impedance seen by a down-mixer in the receiver front-end circuitry 206 can be larger to ensure a lower impact of the associated parasitic capacitance.

In other examples, such as in a transmitter chain, the shared RF transformer or shared inductor may be a coupling element between a plurality of PGAs (in either transmitter/modulation circuitry 222 and/or power amplifier 224) and an antenna 202 of FIG. 2.

In some examples of the invention, the proposed solution is especially useful for low-Vdd designs, where larger device size may be chosen to exhibit a good linearity performance, but is inherently accompanied with a larger parasitic capacitance.

In some examples of the invention, the effect of one (or more) parallel parasitic capacitances, such as 335, 345 from another parallel RF amplifier 330, 340 are reduced (or negated) by inserting a high impedance shared inductor (L1) 315 or shared RF transformer 310 (L1+L2) between the respective amplifier outputs and opening one or more supply switch(es) 320, 322 that provide a supply voltage to the respective amplifier, as illustrated in FIG. 3. For example, in the illustrated example, when second RF amplifier 340 is turned on, the output signal of second RF amplifier 340 being transferred to shared inductor 315 or shared RF transformer 310 is affected by its own parasitic capacitance 345. However, and notably, a controller, such as controller 214 of FIG. 2, is configured to open switch 322 (and thereby disconnect second RF amplifier 340 from its nearby supply voltage) and close switch 320 (and thereby connect second RF amplifier 340 to its distal supply voltage, notably via shared inductor (L1) 315 or shared RF transformer (L1+L2) 310).

Advantageously, the parasitic capacitance (Cpar) 345 associated with the turned 'off' first RF amplifier 330 also serves as a stable capacitor for the nearby supply voltage (VDD) 305.

Thus, at least one first RF amplifier 330 may be coupled to a supply voltage 305 via a first switch 320 and at least one second RF amplifier 340 may be coupled to the supply voltage via a second switch 322. As shown, closing the first switch 320 provides a supply voltage 305 for the second RF amplifier 340, whereby the parasitic capacitance 335 of the at least one first RF amplifier 330 is isolated from the at least one second RF amplifier 340 by the shared inductor 315 or shared RF transformer 310, whilst the second switch is opened (removing a direct supply to the at least one second RF amplifier 340). In this manner, the parasitic capacitance effect of the other parasitic capacitance 335, on the output from the second RF amplifier 340 to the shared inductor 315 or shared RF transformer 310, is significantly reduced.

A second example configuration of an RF amplifier circuit is illustrated at 350, adapted in accordance with some examples of the invention radio frequency (RF) amplifier circuit 300, where multiple RF amplifiers 330, 340 are connected in parallel. In this example, when second RF amplifier 340 is turned 'off', and first RF amplifier 330 is turned 'on', the output signal of first RF amplifier 330 being transferred to shared inductor 315 or shared RF transformer 310 is affected by its own parasitic capacitance 335. However, and notably in this configuration, the switch network is configured to open switch 320 (and thereby disconnect first RF amplifier 330 from its nearby supply voltage) and close switch 322 (and thereby connect first RF amplifier 330 to its distal supply voltage, notably via shared inductor 315 or shared RF transformer 310. As shown, closing the first switch 322 provides a supply voltage 305 for the first RF amplifier 330, whereby the parasitic capacitance 345 of the at least one second RF amplifier 340 is isolated from the at least one first RF amplifier 330 by the shared inductor 315 or shared RF transformer 310, whilst the first switch is opened (removing a direct supply to the at least one first RF amplifier 330). In this manner, the parasitic capacitance effect of the other parasitic capacitance, i.e. parasitic capacitance 345 in this configuration, on the output from the first RF amplifier 340 to the shared inductor 315 or shared RF transformer 310, is significantly reduced.

Advantageously, the parasitic capacitance (Cpar) 345 associated with the turned 'off' second RF amplifier 340 also serves as a stable capacitor for the nearby supply voltage (VDD) 305.

Figure 1:
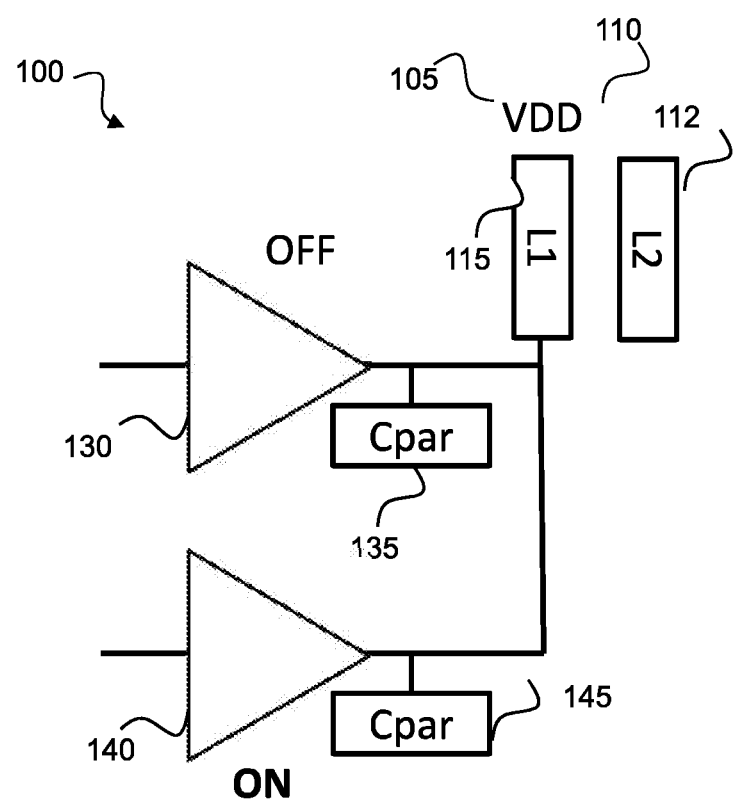
FIG. 1 illustrates a known RF amplifier circuit, where multiple RF amplifiers are connected in parallel.

The inventors of the present invention have recognized that the RF amplifier parasitic capacitances are problematic to achieving a large LNA gain and/or a broadband design. Thus, the parasitic capacitance effect of the other parasitic capacitance 345 on the output to the shared inductor 315 or shared RF transformer 310 from first RF amplifier 330 is significantly reduced, due to the separation between the parasitic capacitances (Cpar) 335, 345 by a high impedance shared inductor 315 or shared RF transformer 310. Furthermore, and advantageously, the prior art designs (such as illustrated in FIG. 1), whereby a low impedance is seen by the mixer (in a receiver architecture) is avoided, as such low impedances create a poor second order intrinsic intermodulation product (IIP2) performance for receiver down-mixers IIP2.

In particular, the switch network is used to configure the shared inductor (L1) 315 or shared RF transformer 310 differently in order to relax parasitic capacitance when two, or multiple, LNAs share the same inductor or transformer loading and not all of said connected LNAs is turned 'on' at a particular instant in time.

In this manner, the RF amplifier circuit design can be relaxed with regard to the loading consideration on the shared inductor 315 or shared RF transformer 310, for example for a multi-path receiver for supporting Inter-band Carrier Aggregation (ICA) and Non-Contiguous Carrier Aggregation (NCCA) applications at the same time. In this manner, the RF designer may have more design flexibility to achieve a broadband and high-impedance design.

In known switched inductor or switched transformer designs, different frequency bands are supported by changing or switching the inductor size, for example, a higher frequency band uses a lower fixed inductance value and a lower frequency band uses a larger fixed inductance value. Thus, in contrast to these known switched inductor or switched transformer designs, examples of the present invention propose an architecture configured to reduce the exhibited parasitic capacitances of the RF amplifiers by connecting multiple RF amplifiers to a single shared inductor or transformer and re-configuring the circuit operation to reduce the exhibited parasitic capacitance effects and/or support different frequency bands, as described with reference to FIG. 5.

In some examples, the aforementioned components may be located on a radio frequency integrated circuit, RFIC, 308. In this manner, the RFIC 308 includes a plurality of parallel radio frequency, RF, signal paths; and one of a shared inductor 315 or transformer 310 located between a first RF signal path of the plurality of parallel RF signal paths that includes at least one first RF amplifier 330 and a second signal path comprising at least one second RF amplifier 340. The at least one first RF amplifier 330 is coupled to a supply voltage 305 via a first switch 320 and at least one second RF amplifier 340 is coupled to the supply voltage 305 via a second switch 322, and the first switch 320 is closed and the second switch 322 is opened, such that the shared inductor 315 or transformer 310 creates a high impedance at an output of the at least one first RF amplifier 330 and when the first switch 320 is closed and the second switch 322 is opened, the supply is provided for the second RF amplifier 340.

Some examples of the invention find particular use in a 3 GHz, 5 GHz or 10 GHz range, where the effects of parasitic capacitance are more prevalent. A typical value of amplifier parasitic capacitance that has been found by the inventors to create problems in some RF amplifier designs is of the order of: Cpar=100 fF to a few pF, dependent upon the technology process.

Referring now to FIG. 4, two example RF amplifier circuit architectures 400, 450 are illustrated, in accordance with some examples of the invention. A first example RF amplifier circuit architecture 400, adapted in accordance with some examples of the invention, includes two RF amplifiers 430, 440, which are connected in parallel. In this first example RF amplifier circuit architecture 400, the parasitic capacitance effect is not shown for simplicity purposes only. In accordance with examples of the invention, each output of the two RF amplifiers 430, 440 is connected to either side of a shared inductor 315, with each RF amplifier 430, 440 provided a supply voltage 305 by a respective switch 320, 322 (or in other examples a different switch network). In some instances, the shared inductor 315 may be a transformer input inductance of a shared RF transformer 310. A shared RF transformer embodiment is also provided with a voltage supply 305 and includes a transformer output inductance 312.

In a similar manner as the RF amplifier circuits of FIG. 3, the effect of one (or more) parallel exhibited parasitic capacitances, from the other parallel RF amplifier 430, 440 are reduced (or negated) by inserting the high impedance shared inductor 315 or shared RF transformer 310 (L1+L2) between the respective amplifier outputs and opening one of the supply switch(es) 320, 322 from the switch network that provide a supply voltage to the respective amplifier.

A second example configuration of an RF amplifier circuit 450, adapted in accordance with some examples of the invention radio frequency (RF) amplifier circuit 300 is also illustrated, where multiple RF amplifiers are connected in slices 450, 460 in two parallel amplifier sets Each amplifier set is located either side of a shared inductor 315 or shared RF transformer 310. Here, in this second example, each of the at least one first RF amplifier and at least one second RF amplifier comprises multiple RF amplifiers located on slices, wherein sets of slices are separated by the shared inductor or transformer.

Thus, as illustrated, example embodiments of the invention may be configured to work with any number of RF amplifiers, and any number of paths, assuming that multiple parallel slices 450, 460 may be located in parallel, each fed by a separate supply voltage 305 and isolated from the supply to the other slice(s) via the high impedance shared inductor 315 or shared RF transformer 310 (L1+L2). In some examples of the invention, only one RF path is turned 'on' at any instant in time. In this manner, the example architecture of FIG. 4 with multiple RF amplifiers may be configured to support a scenario whereby, each RF amplifier may be connected to multiple shared inductors 315 or shared RF transformers 310. Such an architecture may provide increased flexibility when selecting a range of RF amplifiers and their associated shared inductors 315 or shared RF transformers 310 for example for supporting Inter-band Carrier Aggregation (ICA) and Non-Contiguous Carrier Aggregation (NCCA) applications in an LTE™ or similar system.

Referring now to FIG. 5, illustrates a third example overview of a switched RF amplifier circuit configured to support either a lower frequency band with a larger shared inductor employed or a higher frequency band with a smaller shared inductor employed, in accordance with some examples of the invention.

A first configuration 500 of the third example RF amplifier circuit architecture 500, adapted in accordance with some examples of the invention, includes two sets of RF amplifiers 530, 535, which are connected in parallel and located generally on one side of a shared inductor 315 or shared RF transformer 310. A second RF amplifier or set of RF amplifiers 440 is located generally on the other side of the shared inductor 315 or shared RF transformer 310. In this first configuration 500 of the third example RF amplifier circuit architecture 500, the exhibited parasitic capacitance effect is not shown for simplicity purposes only. In accordance with examples of the invention, an output of the first set of RF amplifiers 530 is connected to the shared inductor 315 and provided a supply voltage 305 by a respective switch 320, 322 (or in other examples a different switch network). In some instances, the shared inductor 315 may be a transformer input inductance of a shared RF transformer 310. A shared RF transformer embodiment is also provided with a voltage supply 305 and includes a transformer output inductance 312.

As illustrated, the first set of RF amplifiers 530 is connected to one end 520 of the shared inductor 315 (or shared RF transformer 310), and therefore utilizes all of the inductance of the component, with a consequent effect on the frequency of operation. In this configuration, control of a direction of the current flow within the shared inductor 310 or shared RF transformer 315, indicated by 510, may be used to reduce the effect of the exhibited parasitic capacitances of the respective RF amplifiers connected to the ends of the shared inductor 310 or shared RF transformer 315, as illustrated in FIG. 3. In this configuration, multiple RF amplifiers may be used to support the same frequency band.

In a second configuration 550 of the third example of the invention it is envisaged that the multiple RF amplifiers may be used to support different frequency bands. In this configuration, examples of the invention no longer always connect the RF amplifiers or sets of RF amplifiers to the two end points of the shared inductor 310 or shared RF transformer 315. Depending upon the supported frequency bands, some examples propose to connect the RF amplifier to a selectable internal point, e.g. selectable internal point 570 of the shared inductor 310 or shared RF transformer 315. This selectable internal connection point 570 of the shared inductor 310 or shared RF transformer 315 ensures that the inductance value of the shared inductor 310 or shared RF transformer 315 is reduced according to the tapped inductance indicated by 575. In this configuration, the current flow within the shared inductor 310 or shared RF transformer 315 is indicated by 560, For example, a lower frequency band is supported by a use of the higher inductance in the first configuration 500, with, say, the first set of RF amplifiers 530 connected to selectable internal end point 520 of the shared inductor 310 or shared RF transformer 315. In order to support a higher frequency band, the architecture can be re-configured by reconfiguring the connection point of the shared inductor 310 or shared RF transformer 315 to selectable internal connection point 570 thereby incorporating a lower inductance value. Notably, the same (size of) shared inductor/ transformer is used, but the connecting point of the amplifier (s) is/are selectively adjusted in this configuration. In this manner, the architecture of FIG. 5 may be dynamically re-configurable to provide increased flexibility when selecting a range of RF amplifiers and their associated shared inductors 315 or shared RF transformers 310, for example for supporting Inter-band Carrier Aggregation (ICA) and Non-Contiguous Carrier Aggregation (NCCA) applications in an LTE™ or similar system.

In examples of the invention, a method for sharing an inductor or transformer between multiple RF amplifiers in a communication unit is described. The method includes: locating a shared inductor or transformer between a first RF signal path of a plurality of parallel RF signal paths comprising at least one first RF amplifier and a second signal path comprising at least one second RF amplifier. The method further includes closing a first switch connecting a supply voltage to the at least one first RF amplifier; and opening a second switch connecting the supply voltage to the at least one second RF amplifier, such that the shared inductor or transformer creates a high impedance at the output of the at least one first RF amplifier.

Figure 6:
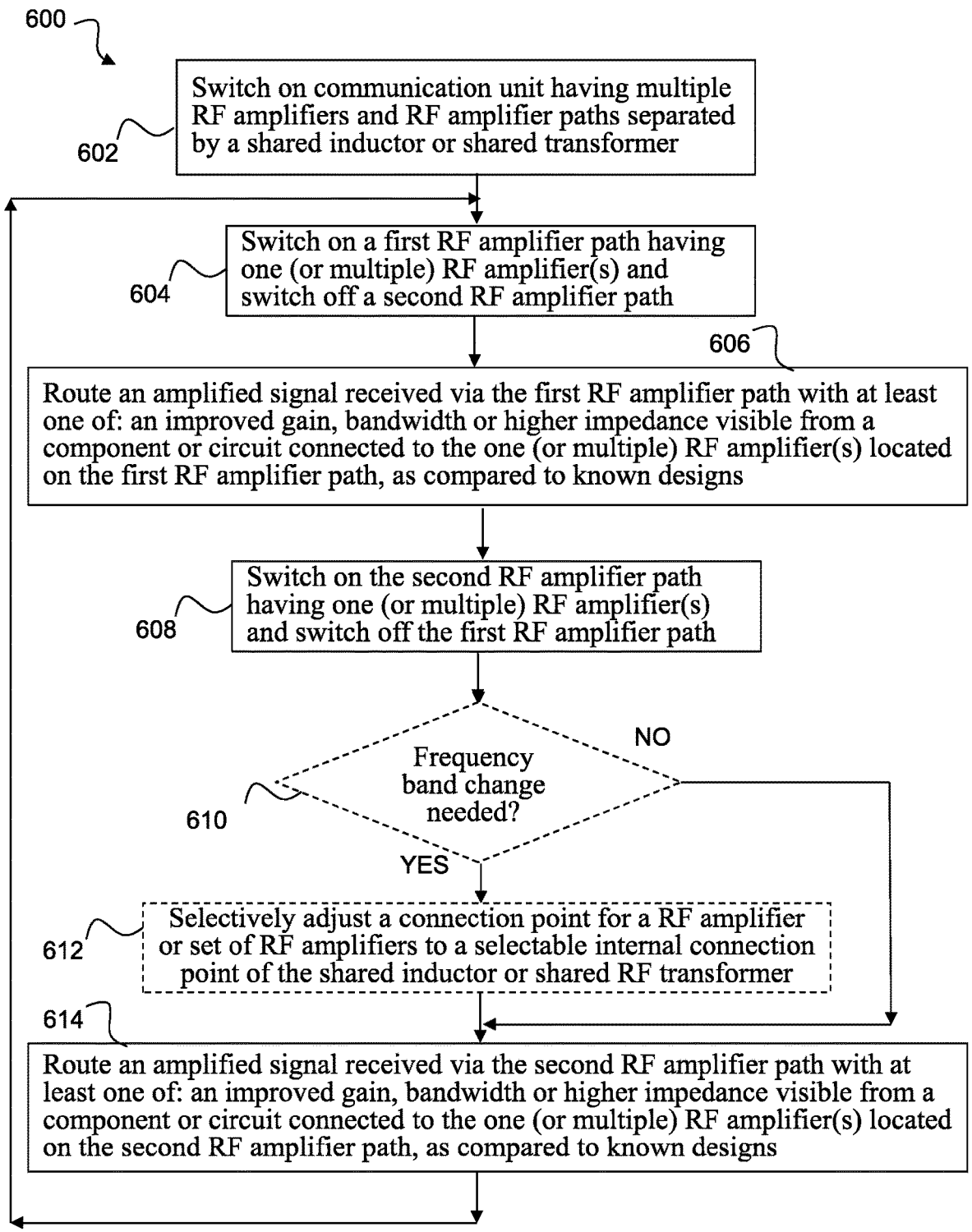
FIG. 6 illustrates an example flowchart of a method for sharing an inductor or transformer between multiple RF amplifiers in order to reduce a loading effect of exhibited parasitic capacitances of parallel paths from the RF amplifiers, in accordance with some examples of the invention.

Referring now to FIG. 6, a detailed example flowchart 600 of a method for sharing an inductor or transformer between multiple RF amplifiers in order to reduce a loading effect of, say, exhibited parasitic capacitances of parallel paths from the RF amplifiers is illustrated, according to examples of the invention. At 602, a communication unit having multiple RF amplifiers and RF amplifier paths separated by a shared inductor or shared transformer is switched 'on'. At 604, a first RF amplifier path having one (or multiple) RF amplifier(s) is switched 'on' and a second RF amplifier path is switched 'off', for examples as described with reference to FIG. 3 or FIG. 5. At 606, an amplified signal received via the first RF amplifier path is routed via the shared inductor or shared transformer with at least one of: an improved gain, bandwidth or higher impedance visible from a component or circuit connected to the one (or multiple) RF amplifier(s) located on the first RF amplifier path, as compared to known designs.

In this switch configuration, the loading effect of, say, the parasitic capacitance is reduced for the RF amplifier that is turned 'on'. At 608, the second RF amplifier path having one (or multiple) RF amplifier(s) is switched 'on' and the first RF amplifier path is switched 'off'.

At 610, an optional determination is made as to whether a different frequency band is needed to be supported by the communication unit, at least a frequency band that may require an adjustment of a shared inductor or shared RF transformer and/or a use of a different RF amplifier or set of RF amplifiers. If, at 610, a different frequency band is not needed by the communication unit, the flowchart loops to 614. However, in accordance with the re-configurable architecture of FIG. 5, if a different frequency band is needed by the communication unit at 610, then the RF circuits are adjusted in the communication unit. In particular, at 612, this re-configuration is achieved by selectively adjusting a connection point for an RF amplifier or set of RF amplifiers to a selectable internal connection point of the shared inductor or shared RF transformer, such that an inherent adjustment of an inductance value of the shared inductor or shared RF transformer by the re-connection point supports a required new frequency band.

At 614, an amplified signal received via the second RF amplifier path is switched 'on' with at least one of: an improved gain, bandwidth or higher impedance visible from a component or circuit connected to the one (or multiple) RF amplifier(s) located on the second RF amplifier path, as compared to known designs. The flowchart may loop back to 604 if the alternative RF amplifier path is then subsequently to be used.

In the foregoing specification, the invention has been described with reference to specific examples of embodiments of the invention. It will, however, be evident that various modifications and changes may be made therein without departing from the scope of the invention as set forth in the appended claims.

Those skilled in the art will recognize that the boundaries between components are merely illustrative and that alternative embodiments may merge components or circuit elements or impose an alternate decomposition of functionality upon various components or circuit elements. Thus, it is to be understood that the architectures depicted herein are merely exemplary, and that in fact many other architectures can be implemented which achieve the same functionality. It is therefore envisaged that other modifications, variations and alternatives are also possible. The specifications and drawings are, accordingly, to be regarded in an illustrative rather than in a restrictive sense.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The connections as discussed herein may be any type of connections suitable to transfer signals from or to the respective nodes, units or devices, for example via intermediary components. Accordingly, unless implied or stated otherwise, the connections may for example be direct connections or indirect connections. The connections may be illustrated or described in reference to being a single connection, a plurality of connections, unidirectional connections or bidirectional connections. However, different illustrated examples may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

It will be appreciated that, for clarity purposes, the above description has described embodiments of the invention with reference to different functional units. However, it will be apparent that any suitable distribution of functionality between different functional units may be used without detracting from the invention. Hence, references to specific functional units are only to be seen as references to suitable means for providing the described functionality, rather than indicative of a strict logical or physical structure or organization.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor or controller. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, solutions have been described, wherein the aforementioned disadvantages with prior art arrangements have been substantially alleviated.

We claim:

1. A communication unit comprising:
 a plurality of parallel radio frequency, RF, signal paths; and
 located between a first RF signal path of the plurality of parallel RF signal paths comprising multiple selectable first RF amplifiers and a second RF signal path comprising multiple selectable second RF amplifiers is one of a shared inductor or shared transformer;
 wherein at least one first RF amplifier of the multiple selectable first RF-amplifiers or a set of selectable first RF amplifiers is coupled to a supply voltage via a first switch and at least one second RF amplifier of the multiple selectable second RF-amplifiers or a set of selectable second RF amplifiers is coupled to the supply voltage via a second switch, and the first switch is closed that provides the supply voltage to the at least one second RF amplifier whilst the second switch is opened, and
 wherein a first selectable RF amplifier or set of selectable RF amplifiers from the multiple selectable first or second RF amplifiers or multiple sets of selectable first or second RF amplifiers is selectively connected to an internal portion of the shared inductor or shared transformer, thereby adjusting an inductance value of the shared inductor or shared transformer.

2. The communication unit of claim 1 wherein the closed first switch causes the shared inductor or shared transformer to create a high impedance at an output of the at least one second RF amplifier of the multiple selectable second RF amplifiers.

3. The communication unit of claim 1 wherein the at least one first RF amplifier exhibits a first output parasitic capacitance and the at least one second RF amplifier exhibits a second output parasitic capacitance connected via the shared inductor or shared transformer and the closed first switch causes the shared inductor or shared transformer to create a high impedance at the output of the at least one second RF amplifier and reduce an effect of the exhibited second output parasitic capacitance at an output of the at least one first RF amplifier.

4. The communication unit of claim 1 wherein the at least one first RF amplifier and at least one second RF amplifier are low noise amplifiers in a receiver path of the communication unit.

5. The communication unit of claim 1 wherein the at least one first RF amplifier of the multiple selectable first RF amplifiers and at least one second RF amplifier of the multiple selectable second RF amplifiers are programmable gain amplifiers or gain elements of a power amplifier in a transmitter path of the communication unit.

6. A communication unit comprising:
 a plurality of parallel radio frequency, RF, signal paths; and
 located between a first RF signal path of the plurality of parallel RF signal paths comprising at least one first RF amplifier and a second signal path comprising at least one second RF amplifier is one of a shared inductor or shared transformer;
 wherein the at least one first RF amplifier is coupled to a supply voltage via a first switch and at least one second RF amplifier is coupled to the supply voltage via a second switch, and the first switch is closed that provides the supply voltage to the at least one second RF amplifier whilst the second switch is opened;
 wherein the at least one first RF amplifier and at least one second RF amplifier each comprise multiple RF amplifiers and wherein the multiple RF amplifiers are located on slices, wherein sets of slices are separated by the shared inductor or shared transformer.

7. A radio frequency integrated circuit, RFIC, comprising:
 a plurality of parallel radio frequency, RF, signal paths; and
 located between a first RF signal path of the plurality of parallel RF signal paths comprising multiple selectable first RF amplifiers and a second RF signal path comprising multiple selectable second RF amplifiers is one of a shared inductor or shared transformer;

wherein the at least one first RF amplifier is coupled to a supply voltage via a first switch and at least one second RF amplifier is coupled to the supply voltage via a second switch, and the first switch is closed that provides the supply voltage to the at least one second RF amplifier whilst the second switch is opened, and wherein a first selectable RF amplifier or set of selectable RF amplifiers from the multiple selectable first or second RF amplifiers or multiple sets of selectable first or second RF amplifiers is selectively connected to an internal portion of the shared inductor or shared transformer, thereby adjusting an inductance value of the shared inductor or shared transformer.

8. The RFIC of claim 7 wherein the closed first switch causes the shared inductor or transformer to create a high impedance at an output of the at least one second RF amplifier.

9. The RFIC of claim 7 wherein the at least one first RF amplifier exhibits a first output parasitic capacitance and the at least one second RF amplifier exhibits a second output parasitic capacitance connected via the shared inductor or shared transformer and the closed first switch causes the shared inductor or shared transformer to create a high impedance at the output of the at least one second RF amplifier and reduce an effect of the exhibited second output parasitic capacitance at an output of the at least one first RF amplifier.

10. The RFIC of claim 7 wherein the at least one first RF amplifier and at least one second RF amplifier comprise at least one from a group of: low noise amplifiers in a receiver path of the RFIC, programmable gain amplifiers in a transmitter path of the RFIC.

11. A radio frequency integrated circuit, RFIC, comprising:
- a plurality of parallel radio frequency, RF, signal paths; and
- located between a first RF signal path of the plurality of parallel RF signal paths comprising multiple selectable first RF amplifiers and a second RF signal path comprising multiple selectable second amplifiers is one of a shared inductor or shared transformer;
- wherein at least one first RF amplifier is coupled to a supply voltage via a first switch and at least one second RF amplifier is coupled to the supply voltage via a second switch, and the first switch is closed that provides the supply voltage to the at least one second RF amplifier whilst the second switch is opened;
- wherein the multiple RF amplifiers are located on slices, wherein sets of slices are separated by the shared inductor or shared transformer.

12. A method for sharing an inductor or transformer by multiple RF amplifiers in a communication unit, the method comprising:
- locating a shared inductor or shared transformer between a first RF signal path of a plurality of parallel RF signal paths comprising multiple selectable first RF amplifiers or set of selectable first RF amplifiers and a second signal path comprising multiple selectable second RF amplifiers or set of selectable second RF amplifiers;
- closing a first switch connecting a supply voltage to the at least one first RF amplifier of the multiple selectable first RF-amplifiers or a set of selectable first RF amplifiers; and
- opening a second switch connecting the supply voltage to at least one second RF amplifier of the multiple selectable second RF-amplifiers or a set of selectable second RF amplifiers, such that the shared inductor or transformer creates a high impedance at the output of the at least one first RF amplifier; and
- selectively connecting a first selectable RF amplifier or set of selectable RF amplifiers from the multiple selectable first or second RF amplifiers or multiple sets of selectable first or second RF amplifiers to an internal portion of the shared inductor or shared transformer, thereby adjusting an inductance value of the shared inductor or shared transformer.

13. The method of claim 12 wherein closing the first switch and opening the second switch comprises creating a high impedance at the output of the at least one second RF amplifier.

14. The method of claim 12 wherein the at least one first RF amplifier exhibits a first output parasitic capacitance and the at least one second RF amplifier exhibits a second output parasitic capacitance connected via the shared inductor or transformer, and wherein closing the first switch and opening the second switch comprises reducing an effect of the exhibited second output parasitic capacitance at an output of the at least one first RF amplifier.

* * * * *